(12) United States Patent
Kanazawa

(10) Patent No.: US 7,631,280 B2
(45) Date of Patent: Dec. 8, 2009

(54) METHOD AND APPARATUS FOR DETERMINING LSI TYPE, METHOD AND APPARATUS FOR SUPPORTING LSI DESIGN, AND COMPUTER PRODUCT

(75) Inventor: Yuzi Kanazawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 280 days.

(21) Appl. No.: 11/655,188

(22) Filed: Jan. 19, 2007

(65) Prior Publication Data
US 2008/0052645 A1 Feb. 28, 2008

(30) Foreign Application Priority Data
Aug. 25, 2006 (JP) ............................. 2006-229266

(51) Int. Cl.
G06F 17/50 (2006.01)
G06F 9/45 (2006.01)
(52) U.S. Cl. .................................. 716/2; 716/4; 716/6
(58) Field of Classification Search ............... 716/2, 716/4, 6
See application file for complete search history.

(56) References Cited

U.S. PATENT DOCUMENTS

| | | | | |
|---|---|---|---|---|
| 5,740,070 A | * | 4/1998 | Nishimoto et al. | 716/11 |
| 5,751,582 A | * | 5/1998 | Saxena et al. | 700/109 |
| 7,484,197 B2 | * | 1/2009 | Allen et al. | 716/10 |
| 2005/0120321 A1 | * | 6/2005 | Auracher et al. | 716/8 |
| 2006/0150129 A1 | * | 7/2006 | Chiu et al. | 716/4 |
| 2007/0256044 A1 | * | 11/2007 | Coryer et al. | 716/13 |
| 2007/0271539 A1 | * | 11/2007 | Murray et al. | 716/7 |

FOREIGN PATENT DOCUMENTS

JP 6-029391 2/1994

* cited by examiner

Primary Examiner—Stacy A Whitmore
Assistant Examiner—Magid Y Dimyan
(74) Attorney, Agent, or Firm—Staas & Halsey LLP

(57) ABSTRACT

In manufacturing a structured ASIC, after production of an intermediate product with a transistor layer or the transistor layer and a metal layer, the transistor speed of each intermediate product is measured and, using the speed and associated statistical data, a maximum transistor speed delay is estimated. Based on the estimate, the type of the structured ASIC is determined from among an existing list of LSI circuit types.

18 Claims, 8 Drawing Sheets

| DESIGNATION | MINIMUM REQUIRED TRANSISTOR SPEED | NUMBER OF PIECES TO BE MANU-FACTURED | NUMBER OF PIECES MAN-UFACTURED |
|---|---|---|---|
| A (LSI FOR COMPANY X DIGITAL TV) | 15 ps | 100000 | 5000 |
| B (LSI FOR COMPANY Y DIGITAL CAMERA) | 20 ps | 200000 | 4000 |
| C (LSI FOR COMPANY Z CELLULAR PHONE) | 18 ps | 1000000 | 100000 |

FIG.2

| DESIGNATION | MINIMUM REQUIRED TRANSISTOR SPEED | NUMBER OF PIECES TO BE MANU-FACTURED | NUMBER OF PIECES MAN-UFACTURED |
|---|---|---|---|
| A (LSI FOR COMPANY X DIGITAL TV) | 15 ps | 100000 | 5000 |
| B (LSI FOR COMPANY Y DIGITAL CAMERA) | 20 ps | 200000 | 4000 |
| C (LSI FOR COMPANY Z CELLULAR PHONE) | 18 ps | 1000000 | 100000 |

FIG.3

| GRADE | 1 | 2 | 3 | 4 |
|---|---|---|---|---|
| MINIMUM LSI TRANSISTOR SPEED | TO 15 ps | 15 ps TO 18 ps | 18 ps TO 21 ps | 21 ps FROM |

| ON-STATE CURRENT | TRANSISTOR SPEED |
|---|---|
| a ~ b [A] | 15 [ps] |
| b ~ c [A] | 16 [ps] |
| c ~ d [A] | 18 [ps] |
| d ~ e [A] | 20 [ps] |

900

| GATE LENGTH | TRANSISTOR SPEED |
|---|---|
| A ~ B [nm] | 15 [ps] |
| B ~ C [nm] | 16 [ps] |
| C ~ D [nm] | 18 [ps] |
| D ~ E [nm] | 20 [ps] |

| MEASUREMENT RESULT | SPEED DISTRIBUTION | |
|---|---|---|
| 15 ps | AVERAGE<br>STANDARD DEVIATION | 15 ps<br>2 ps |
| 16 ps | AVERAGE<br>STANDARD DEVIATION | 16 ps<br>2.1 ps |
| 18 ps | AVERAGE<br>STANDARD DEVIATION | 18 ps<br>2.3 ps |
| 20 ps | AVERAGE<br>STANDARD DEVIATION | 20 ps<br>2.4 ps |
| 24 ps | AVERAGE<br>STANDARD DEVIATION | 24 ps<br>2.8 ps |

1100

METHOD AND APPARATUS FOR
DETERMINING LSI TYPE, METHOD AND
APPARATUS FOR SUPPORTING LSI DESIGN,
AND COMPUTER PRODUCT

CROSS-REFERENCE TO RELATED APPLICATIONS

This application is based upon and claims the benefit of priority from the prior Japanese Patent Application No. 2006-229266, filed on Aug. 25, 2006, the entire contents of which are incorporated herein by reference.

BACKGROUND OF THE INVENTION

1. Field of the Invention

The present invention relates to design of a large-scale integration (LSI), such as a structured application specific integrated circuit (ASIC).

2. Description of the Related Art

Conventionally, ASICs, field programmable gate arrays (FPGA) and structured ASICs are available as application specific LSI circuits. The ASIC has transistor and metal layers specific to the type of LSI to be manufactured that formed on the surface of a silicon wafer (e.g., Japanese Patent Application Laid-Open Publication No. H06-29391).

The FPGA is designed to have its logic components (circuit function) configured after manufacturing, thereby enabling a user to change the behavior by programming after the manufacturing of the LSI.

The structured ASIC has a common transistor layer (or a transistor layer and a metal 1 layer) formed on the surface of a silicon wafer, and by changing the wiring pattern of the metal layer formed thereon, operation of the LSI is determined.

However, for the above-mentioned conventional technologies, as speed variations in LSI operation result depending on conditions at the time of manufacturing, it is difficult to control the performance of LSI to be manufactured. Furthermore, since ASIC and structured ASIC are application specific, design must ensure that after manufacturing, all units meet specified performance levels.

For ASIC and structured ASIC, a great deal of time and cost may be required for the timing design to ensure the performance required for the specific application. In such a case, a design period may be shortened conceivably by using only units that meet performance specifications Since ASIC and structured ASIC, are manufactured specific to an application, units that do not meet performance requirements for the specific application can not be utilized for other applications and hence become useless, resulting in a problem of increased manufacturing cost.

Also, variations in current leakage result depending on the conditions at the time of manufacturing. For this reason, in selection of a package for encapsulating chips, to accommodate chips with high current leakage, a package having a high unit cost is selected.

However, for a chip with a small current leakage, this selection process results in the use of an unnecessarily expensive package, further resulting in a problem of an increased manufacturing cost. Furthermore, in LSIs for which there are great restrictions in terms of power consumption and chip unit price for manufacturing, a great deal of time may be spent on the design to satisfy such restrictions, and thereby leading to a problem of a longer design period.

In the case of FPGA, since logic components are configured after the manufacturing of the LSI, a design change can be made relatively easily at the time of occurrence of a failure. However, a problem with FPGA is that in addition to a high chip unit price, the performance of the LSI that can be manufactured is inferior to that of the ASIC or the structured ASIC.

SUMMARY OF THE INVENTION

It is an object of the present invention to at least solve the above problems in the conventional technologies.

A circuit type determining method according to one aspect of the present invention includes acquiring information for an intermediate product of a structured ASIC having at least a transistor layer; and determining a type of the structured ASIC from among a plurality of circuit types based on the information.

A circuit design support method according to another aspect of the present invention includes measuring an aspect of an intermediate product of a structured ASIC having at least a transistor layer; identifying a grade of the structured ASIC with respect to each intermediate product based on the measured aspect from among a plurality of grades indicating performance; judging, based on the grade identified, whether to continue using current design parameters in designing the structured ASIC.

A computer-readable recording medium according to still another aspect of the present invention stores therein a circuit determining program causing a computer to execute receiving information obtained from an intermediate product of a structured ASIC having at least a transistor layer; determining a type of the structured ASIC to be manufactured from among a plurality of circuit types based on the information.

A computer-readable recording medium according to still another aspect of the present invention stores therein a circuit design support program causing a computer to execute receiving information from an intermediate product, with respect to each intermediate product, of a structured ASIC having at least a transistor layer; identifying a grade of the structured ASIC with respect to each intermediate product based on the information from among a plurality of grades indicating performance; and judging, based on the grade identified, whether to continue using current design parameters in designing the structured ASIC.

A circuit determining apparatus according to another aspect of the present invention includes a receiving unit that receives information from an intermediate product of a structured ASIC having at least a transistor layer; and a determining unit that determines a type of the structured ASIC to be manufactured from among a plurality of types of LSI based on the information.

A circuit design support apparatus according to another aspect of the present invention includes a receiving unit the receives information from an intermediate product, with respect to each intermediate product, of a structured ASIC having at least a transistor layer; an identifying unit that identifies a grade of the structured ASIC with respect to each intermediate product based on the information from among a plurality of grades indicating performance; and a judging unit, based on the grade identified, that judges whether to continue using current design parameters in designing the structured ASIC.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 2 illustrates an example of a list of LSI types;

FIG. 3 illustrates an example of a grade table;

DETAILED DESCRIPTION OF THE PREFERRED EMBODIMENTS

Exemplary embodiments according to the present invention will be explained in detail below with reference to accompanying drawings.

Figure 1:
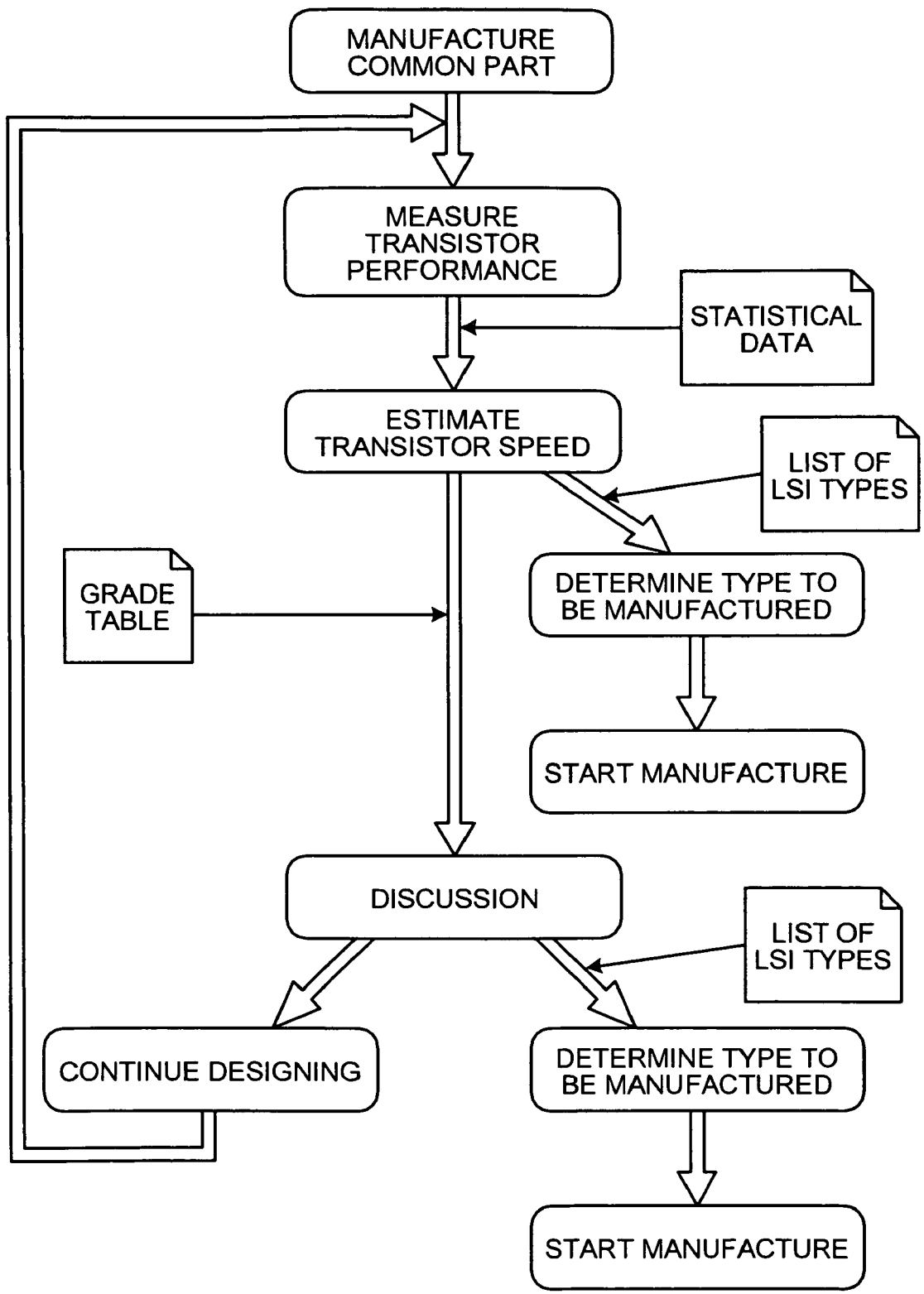
FIG. 1 is a flowchart of an LSI design service according to an embodiment of the present invention.

FIG. 1 is a flow diagram of an LSI design service according to an embodiment of the present invention. In the LSI design service shown in FIG. 1, the manufactured LSI is a structured ASIC.

Structured ASICs are common in structure up to a transistor layer (or a transistor layer and a metal 1 layer) formed on a silicon wafer, and by varying a wiring layer (metal layer) formed thereon, various operations are obtained. Upon formation of the common transistor layer, performance of the LSI is determined to a certain extent in the structured ASIC.

In the LSI service shown in FIG. 1, an LSI manufacturer (a vendor) manufactures an intermediate product by forming the transistor layer (or the transistor layer and the metal 1 layer) on the surface of the silicon wafer. The intermediate product as used here may be a disk-shaped (for example, having a 20 to 50 centimeter radius) silicon wafer with the transistor layer formed thereon or individual chips within such a silicon wafer.

Commonly, the LSI has the transistor layer formed on the surface of the silicon wafer, and the metal layers (metal 1 layer, metal 2 layer, ..., metal n layer) formed thereon in that order. In this case, the intermediate product is manufactured by forming, on the surface of the silicon wafer, the transistor layer and the metal 1 layer that are a common parts.

Then, the LSI manufacturer measures transistor performance of transistors built in the transistor layer of the intermediate product. The transistor performance of each transistor in the transistor layer of the intermediate product varies from one chip to another or from one silicon wafer to another, depending on conditions at the time of manufacturing.

In measuring the transistor performance, a given number of transistors may be selected for measurement rather than measuring all transistors in the transistor layer. A specific method of measuring the transistor performance will be described later.

Then, operation speed of the intermediate product is estimated using results of the above measurement and statistical transistor performance data. Here, the slowest operation speed that can be estimated is estimated as the operation speed of the intermediate product (hereinafter, "transistor speed").

The transistor speed is expressed as a time from the receipt of an electrical signal to a transistor until the output of that signal (delay time), and the delay time becomes shorter as the transistor performance becomes higher. The statistical data on transistor performance and the method of estimating the operation speed using the statistical data on transistor performance will be described later.

Next, out of a list of types of LSI awaiting manufacture, one type of LSI whose operation is ensured by the transistor speed estimated by the above method is selected for manufacture and manufacturing the of the LSI commences according to the design thereof, applying the metal layer and subsequent processing (in this case, the metal 2 layer and subsequent processing).

Upon an intermediate product with a high transistor speed being manufactured, yet the list of types of LSI does not include a LSI that requires a high transistor speed, selection may be made out of those types of LSI that can operate with a slow transistor speed, or the intermediate product with a high transistor speed may be stockpiled for use in the future as the need arises.

The types of LSI awaiting manufacture are described. FIG. 2 is an example of a table listing types of LSI awaiting manufacture. As shown in FIG. 2, the table includes the designation of LSI, the required minimum transistor speed, the number of pieces to be manufactured, and the number of pieces manufactured.

Designation of LSI is, for example, includes designating the application of the LSIs according to electronic appliance and manufacturer, and specifying respective set minimal transistor speeds required for operation. Specifically, for example, the LSI for company X for application in a digital television has a minimum required transistor speed set at 15 picoseconds (ps), and LSIs with slower transistor speeds will not operate.

The number of pieces to be manufactured is, for example, the number of pieces ordered by a customer, company X, and as well as the number set as a manufacturing target. The number of pieces manufactured is the number of pieces already produced. In the example for company X, the number of pieces to be manufactured is 100000, the number of manufactured pieces is 5000, and hence, 95000 pieces remain to be manufactured.

In this LSI design service, by estimating the transistor speed of the intermediate product in the course of LSI manufacturing, intermediate products can be designated for an appropriate type of LSI for further manufacturing according to variations in transistor speed. Further, in estimating the transistor speed the slowest speed is estimated, hence problems resulting from insufficient transistor performance can be prevented.

Another procedure of LSI manufacturing may include meeting with the customer (for example, a home appliance manufacturer) after the transistor speed estimation to discuss the subsequent steps to be taken. Specifically, using a grade table in which LSI performance is classified into a plurality of grades according to the transistor speed, the grade that can be guaranteed with the present state of design is identified.

This grade table is classified into a plurality of grades according to the transistor performance, namely, grades based on the slowest speed with the unit chip price varying at the time of manufacture according to grade.

A specific method of identifying the grade of the estimated transistor speed is described. FIG. 3 is an example of a grade table. As shown in FIG. 3, the LSI performance is classified into 4 grades, grade 1 to grade 4, according to the slowest speed of transistor of the LSI (transistor speed). The range of transistor speed in each grade can be arbitrarily set.

Unit chip price (price of one piece of LSI) at the time of manufacture is determined according to the transistor performance, and increases as the transistor performance increases. In this case, since the transistor performance increases in the order of grade 4, grade 3, grade 2, and grade 1, the unit chip price correspondingly increases in the order of grade 4, grade 3, grade 2, and grade 1.

Specifically, the LSI manufacturer, using the grade table, identifies the grade that can be guaranteed with the current state of the design. For example, by implementing a static timing analyzer (STA) with respect to each grade, the grade that can be guaranteed with the current state of the design can be identified. The STA is a tool that can verify operation of an LSI at a target frequency.

More specifically, the current design data, the target frequency determined by the intended use of the LSI and the transistor speeds corresponding to respective grades are entered into the STA, and based on the received information, the STA verifies operation at the target frequency.

As a result, the grade at which the operation can be guaranteed with the present state of design can be identified. For example, the information such as "when the LSI of grade 4 is used, the LSI does not operate, but when the LSI of grade 3 is used, the LSI operates" can be obtained.

The LSI manufacturer presents the customer with the identified grade and the corresponding unit chip price. The customer, based on the presented unit chip price and the number of chips to be manufactured, determines whether to continue design work (logic design, timing design, etc.) or to commence manufacturing with the present state of the design.

If the judgment is made to continue with the design, then the timing design and logic design are continued in order to improve the transistor performance. When the design has progressed to a certain extent, again the transistor performance is measured, and a grade that can be guaranteed with then current state of design is identified. Then, again discussion is held between the LSI manufacturer and the customer to determine whether to continue with the design or to commence manufacturing with then current state of the design.

If judgment is made not to continue with the design, then the LSI is manufactured with the current state of the design. Specifically, for example, the type of LSI to be manufactured may be determined by selecting one of the types of LSI whose operation is assured by the identified grade, out of the list of types of LSI awaiting manufacturing. Then, in accordance with the design of the determined type of LSI, manufacturing is started for the processing of the metal layer and subsequent layers (in this case, metal 2 and subsequent layers).

Alternatively, the LSI may be registered on the list of types of LSI awaiting manufacturing so that when a suitable chip (intermediate product) appears, the metal layer and subsequent layers (in this case, metal 2 and subsequent layers) are processed.

The above case is arranged such that the LSI manufacturer identifies the grade; however in the event that the timing design is conducted by the customer, the grade may be identified by the customer.

The LSI design service according to the embodiment of the present invention, by measuring the transistor performance in the course of manufacturing, enables selection of an appropriate type of LSI according to measured results, thereby preventing problems such as the manufacture of an inoperable LSI due to insufficient transistor performance.

Furthermore, by presenting the customer with a grade at which the operation can be assured by the current state of the design and a unit price of the chip at such a grade, the LSI manufacturer enables the customer to determine whether or not to continue with the design work. As a result, the customer, by paying a higher price than usual, can obtain a desired LSI in a short period of time, without conducting time consuming timing design work that.

Also, by providing the customer a chip with low performance at a lower price than usual, an LSI can still be manufactured as even a low performance chip can be used for LSI manufacturing. For the customer it is desirable that the unit chip price be as low as possible so long as the chip manufactured achieves the desired performance.

As a result, even low performance chips are used for LSI manufacturing and the waste of chips can be reduced. Further, by not producing wasted chips in LSI manufacturing, the LSI manufacturer can increase the unit chip price.

Figure 4:
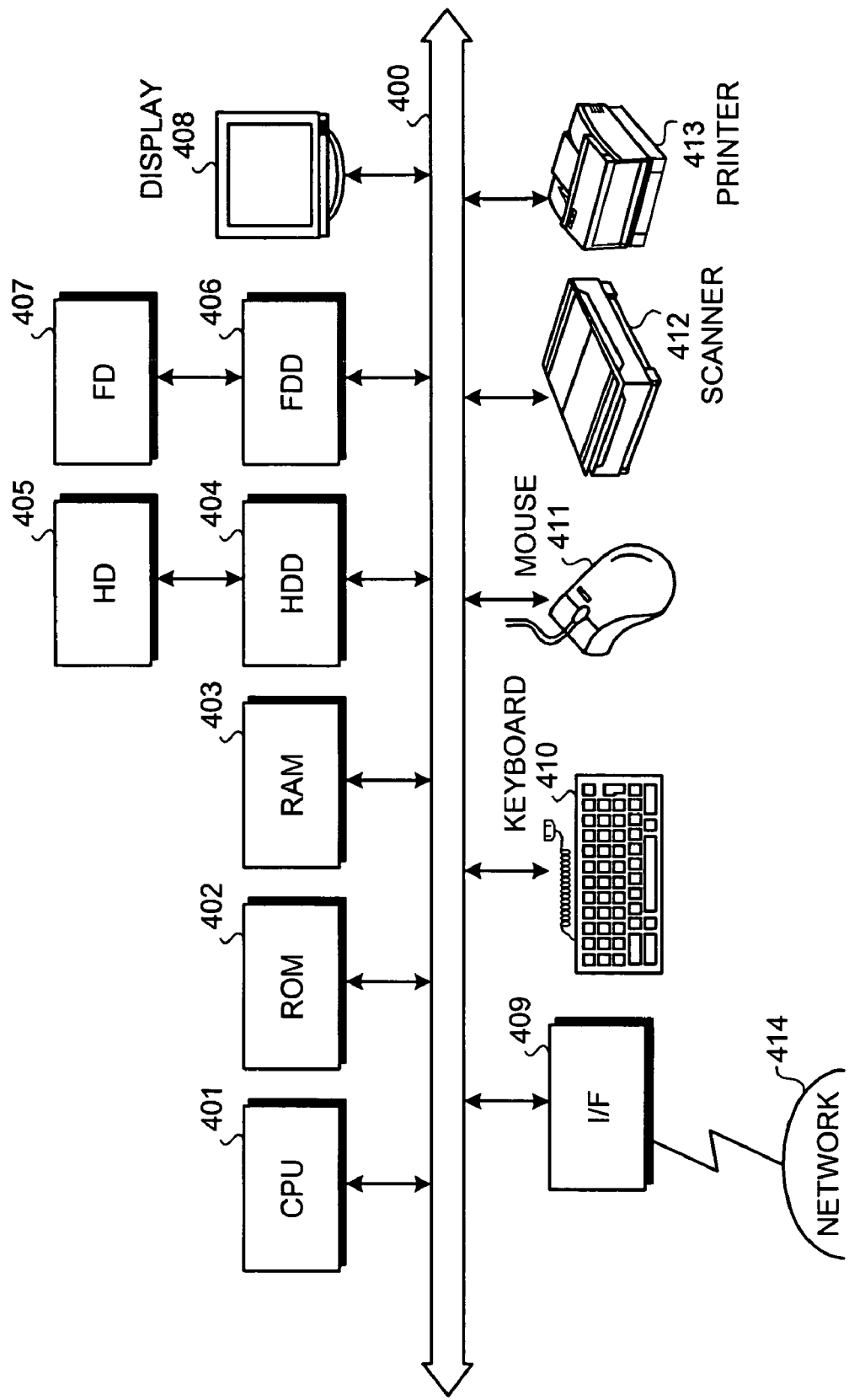
FIG. 4 is a schematic diagram of an LSI design support apparatus according to an embodiment.

FIG. 4 is a block diagram of the LSI design support apparatus according to the embodiment of the present invention.

As shown in FIG. 4, the LSI design support apparatus includes a central processing unit (CPU) 401, a read-only memory (ROM) 402, a random access memory (RAM) 403, a hard disk drive (HDD) 404, a hard disk (HD) 405, a flexible disk drive (FDD) 406, a flexible disk (FD) 407 as an example of a removable recording medium, a display 408, an interface (I/F) 409, a keyboard 410, a mouse 411, a scanner 412, and a printer 413. Components are connected to one another by way of a bus 400.

The CPU 401 governs overall control of the LSI design support apparatus. The ROM 402 stores programs such as an LSI type determining program, LSI design support program and a boot program. The RAM 403 is used as a work area of the CPU 401. The HDD 404 controls reading and writing of data to and from the HD 405 under control of the CPU 401. The HD 405 stores the data written under control of the HDD 404.

The FDD 406 controls reading and writing of data and from the FD 407 under control of the CPU 401. The FD 407 stores the data written under control of the FDD 406 and the data stored in the FD 407 is read by the LSI design support apparatus.

A removable recording medium, besides the FD 407, may be a compact disk read-only memory (CD-ROM) (compact disk-recordable (CD-R), compact disk-rewritable (CD-RW)), a magneto optical disk (MO), a digital versatile disk (DVD), or a memory card. The display 408 displays a cursor, an icon, a tool box, and data such as document, image, and function information. The display 408 may be, for example, a cathode-ray tube (CRT), a thin-film transistor (TFT) liquid crystal display, or a plasma display.

The I/F 409 is connected to a network 414 such as the Internet through a telecommunication line and is connected to other apparatuses by way of the network 414. The I/F 409 serves as an interface between the network 414 and the internal the apparatus and controls the input and output of data to and from external apparatuses. The I/F 409 may be, for example, a modem or a local-area network (LAN) adaptor.

The keyboard 410 is equipped with keys for the input of characters, numerals, and various instructions, and data is entered through the keyboard 410. The keyboard 410 may be a touch-panel input pad or a numeric keypad. The mouse 411 performs a cursor movement, a range selection, a movement or size change of a window. The mouse 411 may be a trackball or a joystick if it has similar functions as a pointing device.

The scanner 412 optically reads an image and takes in the image data into the LSI design support apparatus. The scanner 412 may have an optical character recognition (OCR) function as well. The printer 413 prints image data and document data. The printer 413 may be, for example, a laser printer or an ink jet printer.

Figure 5:
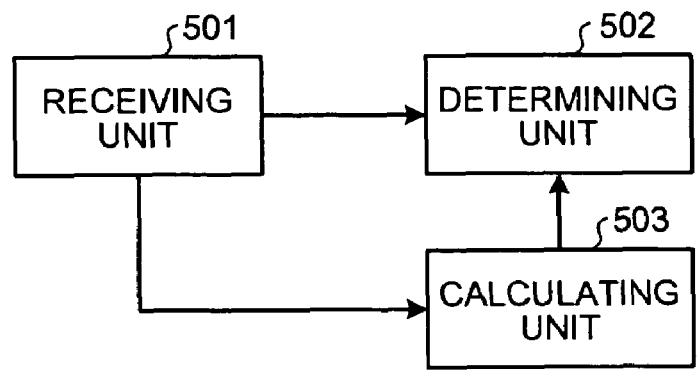
FIG. 5 is a block diagram of an LSI type determining apparatus according to an embodiment.

FIG. 5 is a block diagram of a LSI type determining apparatus according to the embodiment of the present invention. As shown in FIG. 5, an LSI type determining apparatus 500 includes a receiving unit 501, a determining unit 502, and a calculating unit 503.

The receiving unit 501 receives transistor speeds obtained from an intermediate product having at least a transistor layer formed in the process of manufacturing a structured ASIC. The intermediate product has a transistor layer, or a transistor layer and a metal 1 layer, formed on the surface of a silicon wafer.

Specifically, the intermediate product may indicate a silicon wafer as a whole with the transistor layer, or the transistor layer and the metal 1 layer, formed thereon or individual chips within such a silicon wafer. Intermediate products are common parts for all structured ASICs, however the transistor performance of their respective transistors vary depending upon conditions at the time of manufacturing.

The transistor performance is an important index for determining the type of LSI to be manufactured since the minimum requirement of transistor speed is determined for each type of LSI to be manufactured. Therefore, when a product is manufactured using the LSI that does not meet the minimum requirement of transistor speed, a failure due to insufficient transistor performance occurs.

In measuring the transistor speed indicative of the transistor performance, a value having a correlation with the transistor speed can be used. Specifically, for example, the transistor speed can be measured, based on the operating frequency of ring oscillators built in the intermediate product. A ring oscillator is a circuit to realize an oscillating function by combining an odd number of inverter circuits and is used for examining response delay characteristics, etc.

The transistor speed can also be measured based on the magnitude of the current flowing through the intermediate product when transistors in the transistor layer are working. Specifically, the transistor speed is measured using the on-state current indicative of how much current flows through the intermediate product under the circumstances where each transistor on the transistor layer is working (operating).

Furthermore, the transistor speed can be measured based on a gate length of the transistor on the transistor layer. The gate length is a size of a switch for turning on or off the transistor and indicates a distance of movement of an electron within the transistor. The above methods of measuring the transistor speed (measuring methods using the ring oscillator, the on-state current and the gate length) will be described later.

The determining unit 502 determines the type of structured ASIC to be manufactured out of the types of LSI and based on the received transistor speed at the receiving unit 501. The types of LSI are tabulated like the list of types of LSI shown in FIG. 2, are recorded on the recording medium such as the HD 405, and are read out from the recording medium such as HD 405 when the type of LSI to be manufactured is determined by the determining unit 502.

The list of types of LSI may be prepared at the LSI type determining apparatus or the list of types of LSI prepared at another apparatus may be accepted by the receiving unit 501.

Specifically, the determining unit 502 determines, from among the types of LSI, the type of LSI whose minimum requirement of transistor speed is slower than the received transistor speed at the receiving unit 501, as the type of structured ASIC to be manufactured.

More specifically, the determining unit 502, based on the received transistor speed at the receiving unit 501, may determine the type of structured ASIC to be manufactured, from among the list of types of LSI as shown in FIG. 2. For example, if the received transistor speed at the receiving unit is 19 ps, then, from among the list of types of LSI shown in FIG. 2, B (LSI for company Y digital camera) is determined as the type of structured ASIC to be manufactured.

The calculating unit 503 calculates a maximum delay estimate of the transistor speed, using the transistor speeds received at the receiving unit 501 and statistical data associated with such transistor speeds. In measuring the transistor speed, rather than measuring the transistor speed for all transistors on the transistor layer, a given number of transistors may be selected for measurement.

Then, using results of such measurement, the transistor speed of the intermediate product is statistically estimated. Specifically, utilizing the speed distribution (equivalent of statistical data) of transistor speeds under the conditions under which transistor speeds received at the receiving unit 501 were obtained, calculation is made of the slowest value (equivalent of maximum delay estimate) out of the speeds that can be estimated and the result of such calculation is estimated as the transistor speed.

It may be so arranged that the determining unit 502 determines the type of structured ASIC, out of the types of LSI, based on the result of calculation by the calculating unit 503. In this manner, by determining the type of LSI based on the maximum delay estimate calculated by the calculating unit 503, problems due to insufficient transistor performance after the manufacturing can be prevented.

While in the above case, the receiving unit 501 receives transistor speeds measured in advance, it may be so arranged that the LSI type determining apparatus measures the transistor speed. Specifically, for example, a measuring unit not shown may measure the operating frequency of ring oscillators built in the intermediate product and the calculating unit 503 may use results of the measurement for calculating the maximum delay estimate.

The receiving unit 501 may receive a leakage current obtained from the intermediate product with at least the transistor layer formed in the process of manufacturing structured ASIC. The leakage current is a current that flows out, like water leakage, at parts in electrical circuits where current should not flow and is responsible for an increase in power consumption.

The leakage current, like the transistor speed, varies from one chip to another or from one wafer to another, depending on the conditions at the time of manufacturing. Therefore, the type of LSI to be manufactured may be determined by estimating the magnitude of leakage current in place of the above-mentioned transistor speed. To estimate the magnitude of the leakage current, the same method as used for estimating the transistor speed can be used.

The determining unit 502 may determine the type of structured ASIC to be manufactured, out of the types of LSI, based on the leakage current received at the receiving unit 501. Specifically, the determining unit 502 determines, out of the types of LSI, the type of LSI whose leakage current allowance is greater than the leakage current received at the receiving unit 501, as the type of structured ASIC to be manufactured.

More specifically, for example, restrictions regarding the leakage current (for example, allowance of power consumption) may be provided for in the list of types of LSI. In this case, the determining unit 502 selects, from among the list of types of LSI, the type of LSI for which the allowance is set that is greater than the leakage current received at the receiving unit 501 and determines it as the type of structured ASIC to be manufactured.

The receiving unit 501, the determining unit 502, and the calculating unit 503 specifically realize their functions, for example, the CPU 401 executing the program recorded on a recording medium such as the ROM 402, the RAM 403, and the HD 405 of the LSI design support apparatus shown in FIG. 4 or by the I/F 409.

Figure 6:
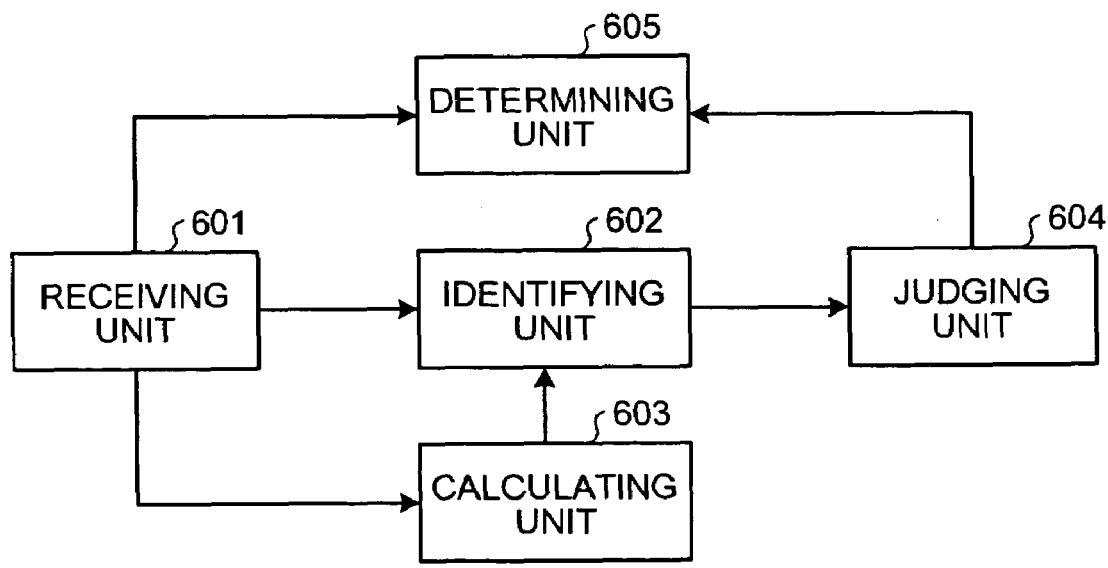
FIG. 6 is a block diagram of an LSI design support apparatus according to an embodiment.

FIG. 6 is a block diagram of the LSI design support apparatus according to the embodiment of the present invention. As shown in FIG. 6, the LSI design support apparatus includes a receiving unit 601, an identifying unit 602, a calculating unit 603, a judging unit 604, and a determining unit 605. Detailed description will be omitted with respect to such parts as are common with the above-mentioned LSI type determining apparatus.

The receiving unit 601 receives the transistor speed obtained from each intermediate product with at least transistor layer formed in the process of manufacturing the structured ASIC. The transistor speed indicates the transistor performance of each intermediate product and can be measured using a value that is correlated with the transistor speed.

The identifying unit 602, based on the received transistor speed at the receiving unit 601, identifies the grade of the structured ASIC with respect to each intermediate product, out of a plurality of grades indicative of LSI performance. The plurality of grades indicative of LSI performance are tabulated like the grade table shown in FIG. 3, are stored in the recording medium such as the HD 405, and are read out from the recording medium such as the HD 405 when the grade is identified by the identifying unit 602.

The grade table showing a plurality of grades may be prepared at the LSI type determining apparatus, or the receiving unit 501 may receive the grade table prepared at another apparatus.

Specifically, for example, the identifying unit 602 identifies, from among the grade table, the grade at which the operation can be assured by the received transistor speed at the receiving unit 601, with respect to each intermediate product. In this case, the identifying unit 602 identifies, from among the grades shown in FIG. 3, the grade to which the received transistor speed at the receiving unit 601 belongs.

More specifically, for example, the identifying unit 602 may apply the STA to each of a plurality of grades and identify the grade at which the operation can be assured by the received transistor speed at the receiving unit 601.

The calculating unit 603 calculates the maximum delay estimate of the transistor speed with respect to each intermediate product, using the transistor speed, with respect to each intermediate product, received at the receiving unit 601 and statistical data associated with such transistor speed.

The identifying unit 602, based on the results of calculation by the calculating unit 603, may identify the grade of the structured ASIC with respect to each intermediate product, out of a plurality of grades indicative of LSI performance. Specifically, the identifying unit 602 identifies the grade at which the operation can be assured by the maximum delay estimate of the transistor calculated by the calculating unit 603, with respect to each intermediate product.

The judging unit 604, based on the grade identified by the identifying unit 602, judges whether to continue the design work using the design data regarding the structured ASIC. Specifically, for example, the judging unit 604 may judge that the design work is not to be continued when the grade identified by the identifying unit 602 matches a certain grade set in advance.

For example, based on the grade identified by the identifying unit 602, the LSI manufacturer or the customer may judge whether to continue the design work and input the judgment result. In such a case, the judging unit 604, based on the result of judgment received at the receiving unit 601, may judge whether to continue the design work using the design data regarding the structured ASIC.

When the judgment by the judging unit 604 is not to continue the design work, the determining unit 605, based on the received transistor speed at the receiving unit 601, determines the type of structured ASIC to be manufactured with respect to each intermediate product, out of the types of LSI.

Specifically, the determining unit 605 determines, from among the types of LSI, the type of LSI whose minimum requirement of transistor speed is slower than the received transistor speed at the receiving unit 601, as the type of the structured ASIC to be manufactured.

When the type of LSI is determined by the determining unit 605, the determined type of LSI may be registered in a list of types of LSI (for example, the list of types of LSI shown in FIG. 2) and when an intermediate product matching such type of LSI is manufactured, then the LSI manufacturing may start. Namely, when the type of LSI is determined by the determining unit 605, the type of LSI is registered in the list of types of LSI and awaits manufacturing.

The receiving unit 601 may receive the leakage current obtained from the intermediate product with at least the transistor layer formed in the process of manufacturing the structured ASIC, with respect to each intermediate product.

In this case, the identifying unit 602, based on the leakage current received at the receiving unit 601, may identify, out of a plurality of grades indicative of LSI performance, the grade of the structured ASIC to be manufactured, with respect to each intermediate product.

Specifically, for example, the identifying unit 602 identifies the grade to which the leakage current received at the receiving unit 601 belongs, out of a grade table classified into a plurality of grades by the leakage current allowance.

While in the above case, the receiving unit 601 receives the transistor speed measured in advance, it may be so arranged that the transistor speed is measured at the LSI design support apparatus.

The receiving unit 601, the identifying unit 602, the calculating unit 603, the judging unit 604, and the determining unit 605 specifically realize their functions, for example, by the execution by the CPU 401 of the program recorded on a recording medium such as the ROM 402, the RAM 403, and the HD 405 of the LSI design support apparatus shown in FIG. 4 or by the I/F 409.

Figure 7:
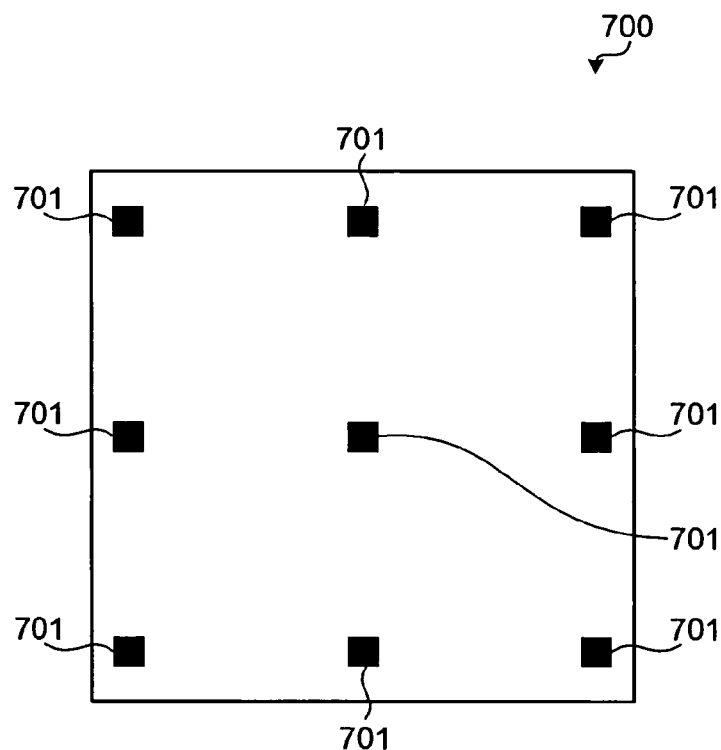
FIG. 7 is a magnified view of a chip having a transistor layer and a metal 1 layer.

Specific description will be made of a method of measuring the transistor performance of the intermediate product (hereinafter, "chip"). Description will now be made of the method of measuring the transistor performance using a ring oscillator built in the chip. FIG. 7 is a magnified view of the chip with the transistor layer and the metal 1 layer formed.

As shown in FIG. 7, a plurality (in this case, 9 pieces) of ring oscillators 701 is embedded in a chip 700. The ring oscillator 701 is a circuit to realize an oscillating function by combining an odd number of inverter circuits. The ring oscillator 701 is designed to operate when the transistor layer and the metal 1 layer have been formed on the surface of the silicon wafer.

After the manufacture of the transistor layer and the metal 1 layer, already embedded ring oscillators 701 are made to operate and the operating frequency of each of the ring oscillators 701 is measured. Next, an average of the measured operating frequencies is calculated. Then, based on the calculated average and the statistical data, the transistor speed of the chip 700 is obtained.

In the chip 700, the operating frequency of the ring oscillator 701 is correlated with the transistor speed. Namely, the ring oscillator 701 is a chin of the transistors, and when, for example, a chain of 100 transistors is operating at 1 GHz, at how high transistor speed each transistor is operating can be measured.

Then, based on the measured transistor speed and the statistical data, the transistor speed of the chip 700 is estimated. Description of the estimation of the transistor speed based on the statistical data will be given later. While, in the above case, the operating frequency is measured using the ring oscillators 701 embedded in the chip 700, the operating frequency may be measured using other apparatus having the oscillating function in the chip 700.

Description will then be made of the method of measuring the transistor speed using the on-state current that indicates the magnitude of current flow when the transistors within the chip are working (operating). The on-state current is correlated with the operating speed of transistor, and is characterized in that if the on-state current is high, the operating speed is high and if the on-state current is low, the operating speed is low.

Figure 8:
FIG. 8 is a table illustrating the relationship between transistor speed and on-state current.

Utilizing such characteristics, the transistor speed of the chip is measured. FIG. 8 is table illustrating an example of the relationship between the transistor speed and the on-state current. A table 800 of FIG. 8 shows the transistor speed corresponding to the value (range) of the on-state current flowing through the chip. Using the table 800, measurement can be made of the transistor speed corresponding to the on-state current flowing through the chip.

Specifically, the on-state current is measured in the state where the transistors within the chip are working. Then, from the result of the measurement and the table 800 shown in FIG. 8, the transistor speed to which the result of the measurement belongs is identified. For example, when the measured on-state current was b ampere (A), the value belongs to the range of "equal to or more than b A, but less than c A" in the table 800 and therefore, the transistor speed can be identified as 16 ps.

Then, based on the identified transistor speed and the statistical data, the transistor speed of the chip is estimated. Description of the estimation of the transistor speed based on the statistical data will be given later.

Description will then be made of the method of measuring the transistor speed using the gate length of the transistor. The gate length is a size of a switch for turning on or off the transistor and indicates the distance of movement of an electron within the transistor. Namely, in an electronic circuit, the shorter the gate length is, the shorter time it takes for an electron to move and the operating speed of the transistor increases.

For measuring the transistor speed, the gate length of the transistor is measured using a microscope, etc. Since measured values of the gate length of the transistor are also utilized, for example, in judging whether the transistor can operate normally, the measured values (gate length) measured on such occasion may be utilized.

Figures 9, 10:
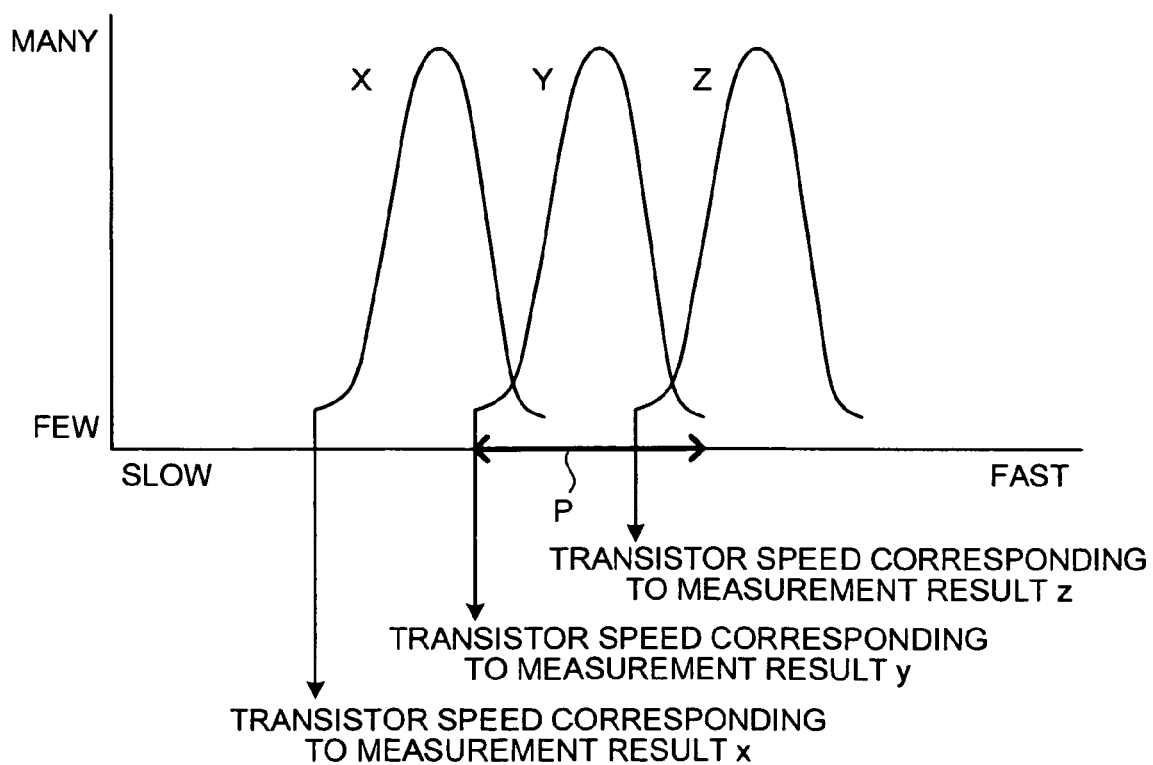
FIG. 9 is a table illustrating the relationship between transistor speed and a gate length.
FIG. 10 is a graph of transistor speed variations.

Next, using a table showing transistor speeds corresponding to various gate lengths, the transistor speed associated with the measured value is identified. FIG. 9 is a table illustrating an example of the relationship between the transistor speed and the gate length. A table 900 shown in FIG. 9 indicates the transistor speed corresponding to each gate length (range).

Then, from the result of measurement (gate length) and the table 900, the transistor speed is identified. For example, when the result of measurement is C nanometer (nm), the value belongs to the range of "equal to or more than C nm, but less than D nm" in the table 900 and therefore, the transistor speed can be identified as 18 ps.

Then, based on the identified transistor speed and the statistical data, the transistor speed of the chip is estimated. Description of the estimation of the transistor speed based on the statistical data will be given later.

Specific description will then be made of the estimation of the transistor speed using the result of measurement according to the above-mentioned method and the statistical data. Description will now be made of variations of the transistor speed when certain results of measurement are obtained.

FIG. 10 is an explanatory diagram of an example of variations of the transistor speed. Variations are caused to the transistor speed of transistors within a chip, depending on conditions at the time of manufacturing of chips. As shown in FIG. 10, variations of the transistor speed at the time of manufacturing of chips can be expressed by a normal distribution (horizontal axis: transistor speed; vertical axis: proportion of an obtained measurement result to the total) indicated by curves X, Y, and Z in the same diagram.

Curves X, Y, and Z are a normal distribution indicative of variations when measurement results x, y, and z were obtained, respectively. Specifically, for example, variations of the transistor speed when measurement result y was obtained are expressed by the curve Y, and as the transistor speed comes close to an average of the transistor speed, the proportion of such transistor speed to the total increases, and as the transistor speed becomes lower or higher, the proportion of such transistor speed to the total decreases.

The transistor speed that can be estimated when the measurement result y is obtained is within the range indicated by an arrow P in the same diagram. In estimating the transistor speed, since the slowest speed within the range that can be estimated is estimated as the transistor speed, the slowest speed in each of the curves X, Y, and Z is estimated as the transistor speed.

Figures 11, 12:
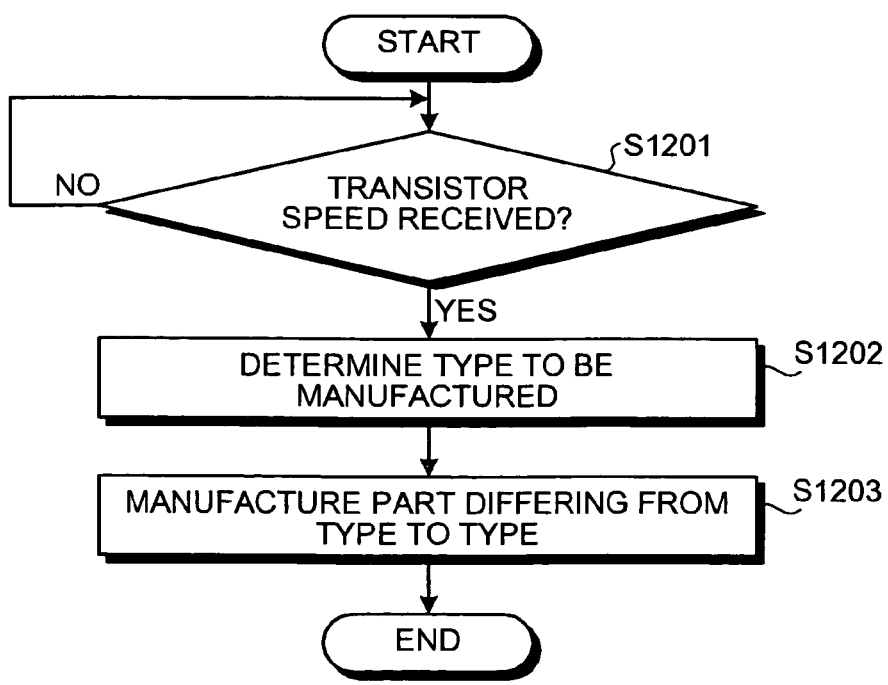
FIG. 11 is a table of statistical data relevant to transistor speed.
FIG. 12 is a flowchart of a type determining process.

Description will now be made of the statistical data representing the variations of the transistor speed as shown in FIG. 10. FIG. 11 is an explanatory diagram of an example of statistical data regarding the transistor speed. As shown in FIG. 11, a statistical data 1100 shows a distribution of the transistor speed within the same chip or the same silicon wafer when each measurement result (transistor speed) was obtained.

From the statistical data 1100 and the transistor speed measured by any of various methods, the transistor speed of the chip is estimated. Specifically, for example, when the measured transistor speed is 20 ps, the transistor speed is distributed so that the average is 20 ps and the standard deviation is 2.4 ps. Namely, the variations of the transistor speed occur in the range of 17.6 ps to 22.4 ps.

Here, the slowest speed within the range that can be estimated is estimated as the transistor speed. In this case, out of the range of 17.6 ps to 22.4 ps, the slowest speed, 22.4 ps, is estimated as the transistor speed.

When the transistor speed was measured at plural points on the chip (plural measurement results exist), the transistor speed may be estimated using the values obtained by calculating an average and a distribution of plural measurement results.

While the statistical data 1100 shows the transistor speed distribution in association with the transistor speed identified by the above method, the transistor speed distribution may be shown in association with, for example, an average of measured operating frequencies of the ring oscillators. In this case, the transistor speed can be estimated from the average of operating frequencies of the ring oscillators.

Description will now be made of an example of a method of preparing statistical data (such as the statistical data 1100 shown in FIG. 11). In preparing the statistical data regarding the transistor speed, the transistor speed of actual chip is measured and actual data on the transistor speed is collected. Next, from the results of the measurement, speed distribution of the transistor speed is obtained. From the obtained speed distribution, statistical data (a table) representing the transistor speed distribution is prepared, using the "estimation" (publicly known technology) of statistics.

FIG. 12 is a flowchart of a type determining processing procedure executed in the LSI design support apparatus according to the embodiment of the present invention.

In the flowchart shown in FIG. 12, the LSI design support apparatus judges whether it has received the transistor speed regarding the chip to be manufactured (step S1201). The transistor speed to be received is the one estimated from the transistor speed measured by any of various methods and the statistical data, and is the slowest value out of the transistor speeds that can be estimated.

More specifically, description will be made of a case in which, for example, the received transistor speed is 17 ps, and the list of types of LSI waiting for manufacturing is the list of types of LSI shown in FIG. 2. In this case, the type of LSI whose minimum requirement of transistor speed is satisfied by the received transistor speed is the B (LSI for company Y digital camera) and the C (LSI for company Z cellular phone). Therefore, the B (LSI for company Y digital camera) and the C (LSI for company Z cellular phone) can be selected as the types of LSI to be manufactured.

While there two options of the B (LSI for company Y digital camera) and the C (LSI for company Z cellular phone), priority may be given to the type of LSI whose minimum requirement of transistor speed is a higher speed and the C (LSI for company Z cellular phone) may be selected as the type of LSI to be manufactured. Alternatively, priority may be given to the type of LSI whose minimum requirement of transistor speed is a slower speed and the B (LSI for company Y digital camera) may be selected as the type of LSI to be manufactured.

Furthermore, when the transistor speed is higher than the minimum requirement of transistor speed in the list of types of LSI and the difference is great, the chip to be manufactured may be stockpiled so that it may be used when the type of LSI that needs a high transistor speed appears.

Specifically, when the received transistor speed is 10 ps, all types of LSI in the list of types of LSI shown in FIG. 2 can be selected. However, since the difference between the received transistor speed and the minimum requirement of transistor speed is great (as much as 5 ps even if compared with the highest speed), the chip to be manufactured may be stockpiled so that it may be used when the type of LSI that needs a high transistor speed appears. The difference of the transistor speeds necessary for stockpiling can be arbitrarily set.

The type of LSI to be manufactured may be determined based on the number of pieces to be manufactured, and the number of pieces already manufactured, in the list of types of LSI. Specifically, for example, when the number of pieces already manufactured exceeds the number of pieces to be manufactured with respect to a certain type of LSI, that type of LSI may not be selected. When a degree of manufacturing achievement (a ratio of the number of manufactured pieces to the number of pieces to be manufactured) of a particular LSI is significantly smaller than that of other LSIs, priority may be given to the manufacture of the particular LSI.

Then, based on the design of the determined type of LSI, such part of the LSI that differs from one type of LSI to another is manufactured (step S1203), and a sequence of processing according to this flowchart is finished. Specifically, the metal and subsequent layers (in this case, metal 2 and subsequent layers) are manufactured in accordance with the design of the type of LSI determined at step S1202.

While, in the above case, the type of LSI to be manufactured is automatically determined, the LSI manufacturer, the customer, etc. may evaluate appropriate types of LSI while consulting the list of types of LSI and may determine the type of LSI to be manufactured.

While, in the above case, the transistor speed is received at step S1201, a process of estimating the transistor speed may be added. Specifically, for example, when ring oscillators are embedded in each chip, a process may be added of measuring the operating frequency of ring oscillators and estimating the speed estimate of the transistor speed, before the process of step S1201.

Namely, the LSI design support apparatus may be so arranged that it can estimate the transistor speed. Alternatively, the LSI design support apparatus may be so arranged as to estimate the transistor speed by receiving data on the on-state current and the gate length in each chip.

While, in the above case, the type of LSI to be manufactured is determined according to the minimum requirement of transistor speed, the type of LSI may be determined according to the magnitude of the leakage current flowing through the chip.

As seen above, the LSI design support apparatus can determine an appropriate type of LSI according to the received transistor speed in the midst of manufacturing of LSI and as a result, can prevent such a problem that manufactured LSI does not operate due to insufficient transistor performance, contributing to the improvement of yield in the LSI manufacturing.

Figure 13:
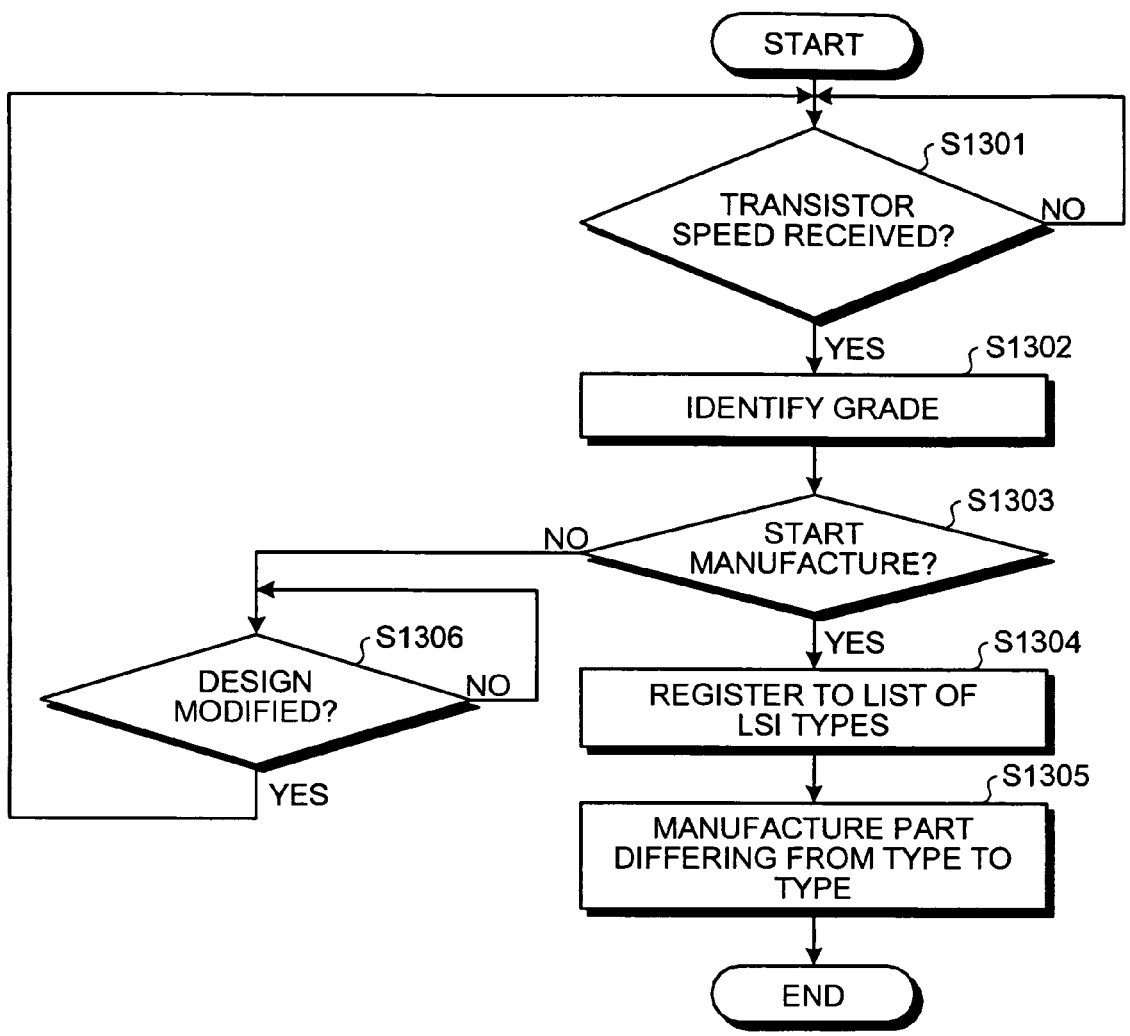
FIG. 13 is a flowchart of an LSI design support process.

FIG. 13 is a flowchart of an LSI design support processing procedure executed in the LSI design support apparatus according to the embodiment of the present invention.

In the flowchart of FIG. 13, the LSI design support apparatus judges whether the transistor speed of each chip has been received (step S1301). The transistor speed to be received is the one estimated from the transistor speed measured by any of various methods and the statistical data, and is the slowest value out of the transistor speeds that can be estimated.

The LSI design support apparatus waits for receipt of the transistor speed and if the transistor speed is received (step S1301: Yes), then the apparatus, using the grade table, identifies the grade at which the operation can be guaranteed with the present state of design (step S1302). Specifically, for example, by applying the STA to each grade shown in such grade table as shown in FIG. 3, the grade is identified that can be guaranteed with the present state of design.

Then, judgment is made of whether to start manufacturing with the present state of design (step S1303). Specifically, for example, judgment may be made of whether to start manufacturing with the present state of design, based on manufacturing start conditions set in advance.

The manufacturing start conditions are, for example, conditions of the grade, the chip unit price, the manufacturing cost, etc., for starting the manufacturing. Specifically, the judgment to start manufacturing may be made when the grade identified at step S1302 is the grade set in advance as manufacturing start conditions. Alternatively, the judgment to start manufacturing may be made when the manufacturing cost in case of starting manufacturing with the present state of design is within the manufacturing cost set in advance.

Judgment of whether to continue the design work may be input by the user. Specifically, for example, the LSI manufacturer presents the customer with the information such as the grade identified at step S1302, the chip unit price at such a grade, and the number of pieces of LSI already manufactured. Based on the presented information, the customer judges whether to continue the design (logic design, timing design, etc.) or to start the manufacturing with the present state of design.

The data on the result of judgment is input by the LSI manufacturer to the LSI design support apparatus. In this case, the LSI design support apparatus, based on the received result of judgment, judges whether to start manufacturing with the present state of design.

In the case of starting manufacturing with the present state of design (step S1303: Yes), the LSI is registered on the list of types of LSI (step S1304) and waits for manufacturing. Specifically, the information such as the designation of LSI (type of LSI), the number of pieces to be manufactured, and the number of pieces already manufactured is registered on the list of types of LSI, together with the minimum requirement of transistor speed corresponding to the grade identified at step S1302.

When a chip with suitable grade appears, the part that differs from one type of LSI to another is manufactured based on the design of the type of LSI (step S1305) and a sequence of processing according to this flowchart is finished. Specifically, the metal and subsequent layers of LSI are manufactured according to the design of the type of LSI.

When manufacturing is not started at step S1303 (step 1303: No), judgment is made of whether design change has been made (step S1306). Specifically, when the manufacturing is not started, designing is continued so that the LSI may be operable with a more inexpensive grade. Namely, improvement of design is tried so that LSI can be manufactured using a chip with a lower chip unit price, though the time and cost increase due to the continued design period.

When, while waiting for the design change, the design is changed (step S1306: Yes), the process goes back to step S1301 and a sequence of processing is repeated. Specifically, when, while waiting for receipt of changed design data, such data is received, then receipt of the transistor speed after the design change is awaited and a sequence of processing is repeated.

While, in the above case, receipt of the transistor speed is accepted at step S1301, a process of estimating the transistor speed may be added. Specifically, for example, when ring oscillators are embedded in each chip, a process may be added of measuring the operating frequency of ring oscillators and estimating the speed estimate of the transistor speed, before the process of step S1301.

Namely, the LSI design support apparatus may be so arranged that it can estimate the transistor speed. Alternatively, the LSI design support apparatus may be so arranged as to estimate the transistor speed by receiving data on the on-state current and the gate length in each chip.

While, in the above case, the grate table is classified into a plurality of grades according to the minimum requirement of transistor, the table may be classified according to the magnitude of the leakage current flowing through the chip. In this case, receipt of the leakage current instead of the transistor speed is accepted at step S1301, and out of the grade table, the grade at which the operation can be guaranteed with the present state of design may be identified, based on the received leakage current.

As seen above, by using a high-performance, expensive chip for LSI manufacturing in the midst of manufacturing, an option of shortening the design period can be provided to the customer and as a result, the customer, by paying a higher amount of money than usual, can terminate the timing design that requires a great amount of time and obtain the desired LSI within a short period of time.

The LSI manufacturer can also provide the customer with a service of improving the design so that the LSI can operate even with a chip of an inexpensive grade (the grade of a slow transistor speed) and decreasing the chip unit price. For example, if the number of pieces of LSI to be manufactured is n and a decrease in the chip unit price achieved by the design improvement is p, then the decrease of manufacturing cost is n×p.

The LSI manufacturer receives a part of the decrease of the manufacturing cost as a consideration of the service and can allocate the rest to suppressing the expenditures of the customer. In this manner, the LSI manufacturer can obtain a consideration for the decrease of the manufacturing cost and the customer can reduce the manufacturing cost.

As described above, the embodiment of the present invention enables selection of an appropriate type of LSI according to the received transistor speed in the midst of manufacturing of LSI and as a result, prevention of such a problem that manufactured LSI does not operate due to insufficient transistor performance, contributing to the improvement of yield in the LSI manufacturing.

Also, by using a high-performance, expensive chip for LSI manufacturing in the midst of manufacturing, an option of shortening the design period can be provided to the customer and as a result, the customer, by paying a higher amount of money than usual, can terminate the timing design that requires a great amount of time and obtain the desired LSI within a short period of time.

The shortening of the design period in the LSI manufacturing is very important for the manufacturers providing electric appliances. For example, for the manufacturers, etc., who manufacture products from the introduction period to the initial stage of the growth period, the advantage of shipping products early is great, even if the manufacturing cost is increased to a certain extent, since the first manufacturer to introduce a product into the market has a high possibility of securing a large market share in respect of the product.

Furthermore, if such a share has been secured, the manufacturer, by shifting to the product using an ASIC from the middle stage of the growth period to the maturity period, can achieve a mass production with the manufacturing cost suppressed and obtain further profits.

Also, by providing the customer with a chip of low performance at a lower price than usual, even a low performance chip can be used for LSI manufacturing. For it is desirable for the customer that the chip unit price be as low as possible so long as the LSI satisfying desired performance is manufactured.

As a result, even low performance chips are used for LSI manufacturing and a waste of chip can be reduced. Further, the LSI manufacturer can raise the chip unit price without producing wasted chips in the LSI manufacturing.

The LSI manufacturer can also provide the customer with a service of improving the design so that the LSI can operate even with a chip of an inexpensive grade (the grade of a slow transistor speed) and decreasing the chip unit price.

As a result, the LSI manufacturer receives a part of the decrease of the manufacturing cost as a consideration of the service and can allocate the rest to suppressing the expenditures of the customer. In this manner, the LSI manufacturer can obtain a consideration for the decrease of the manufacturing cost and the customer can reduce the manufacturing cost.

The LSI type determining method and the LSI design support method described in the embodiment of the present invention can be realized by executing the pre-arranged program on computers such as personal computers, and workstations. This program is recorded on a computer-readable recording medium such as a hard disk, a flexible disk, a CD-ROM, an MO, and a DVD and is executed by being read out from a recording medium by a computer. This program may be in the form of transmission medium that can be distributed by way of networks such as Internet.

The present invention achieves an increased yield in the LSI manufacturing.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A circuit type determining method comprising:
   acquiring information for an intermediate product of a structured application specific integrated circuit (ASIC) having at least a transistor layer; and
   determining a type of the structured ASIC from among a plurality of circuit types based on the information using a computer;
   wherein the intermediate product forms a common transistor layer, or a common transistor layer and a metal layer, on the surface of a selected wafer.

2. The circuit type determining method according to claim 1, wherein the information is a transistor speed measured from the intermediate product.

3. The circuit type determining method according to claim 2, further comprising:
   calculating a maximum delay estimate of transistor speed from the transistor speed and associated statistical data, and
   determining the type of the structured ASIC based on the maximum delay estimate.

4. The circuit type determining method according to claim 2, wherein the transistor speed is measured based on operating frequencies of a ring oscillator built in the intermediate product.

5. The circuit type determining method according to claim 2, wherein the transistor speed is measured based on a magnitude of an electric current flowing through the intermediate product when transistors in the transistor layer are working.

6. The circuit type determining method according to claim 2, wherein the transistor speed is measured based on a gate length of transistors in the transistor layer.

7. The circuit type determining method according to claim 1, wherein
   the information is a leakage current measured from the intermediate product; and
   the type of the structured ASIC is determined from among a plurality of LSI types based on the leakage current.

8. A computer-readable recording medium that stores therein a circuit determining program causing a computer to execute:
   receiving information obtained from an intermediate product of a structured ASIC having at least a transistor layer; and
   determining a type of the structured ASIC to be manufactured from among a plurality of circuit types based on the information;
   wherein the intermediate product forms a common transistor layer, or a common transistor layer and a metal layer, on the surface of a selected wafer.

9. The computer-readable recording medium according to claim 8, wherein the information is a transistor speed measured from the intermediate product.

10. The computer-readable recording medium according to claim 9, further executing:
    calculating a maximum delay estimate of transistor speed from the transistor speed and associated statistical data, and
    determining the type of the structured ASIC based on the maximum delay estimate.

11. The computer-readable recording medium according to claim 9, wherein the transistor speed is measured based on operating frequencies of ring oscillators built in the intermediate product.

12. The computer-readable recording medium according to claim 9, wherein the transistor speed is measured based on a magnitude of an electric current flowing through the intermediate product when transistors in the transistor layer are working.

13. The computer-readable recording medium according to claim 9, wherein the transistor speed is measured based on a gate length of transistors in the transistor layer.

14. The computer-readable recording medium according to claim 8, wherein
    the information is a leakage current measured from the intermediate product; and
    the type of the structured ASIC is determined from among a plurality of LSI types based on the leakage current.

15. A circuit determining apparatus comprising:
    a receiving unit that receives information from an intermediate product of a structured ASIC having at least a transistor layer; and
    a determining unit that determines a type of the structured ASIC to be manufactured from among a plurality of types of LSI based on the information;
    wherein the intermediate product forms a common transistor layer, or a common transistor layer and a metal layer, on the surface of a selected wafer.

16. The circuit determining apparatus according to claim 15, wherein the information is a transistor speed from the intermediate product.

17. The circuit determining apparatus according to claim 16 further comprising:
    a calculating unit that calculates a maximum delay estimate of the transistor speed using the transistor speed and associated statistical data, wherein
    based on the calculated result, the type of the structured ASIC is determined.

18. The circuit determining apparatus according to claim 15, wherein the information is a leakage current from the intermediate product.

* * * * *